US 6,627,980 B2

(12) United States Patent
Eldridge

(10) Patent No.: US 6,627,980 B2
(45) Date of Patent: Sep. 30, 2003

(54) STACKED SEMICONDUCTOR DEVICE ASSEMBLY WITH MICROELECTRONIC SPRING CONTACTS

(75) Inventor: Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 134 days.

(21) Appl. No.: 09/833,369

(22) Filed: Apr. 12, 2001

(65) Prior Publication Data

US 2002/0149095 A1 Oct. 17, 2002

(51) Int. Cl.$^7$ ............................................. H01L 23/02
(52) U.S. Cl. ...................... 257/678; 257/77; 257/686; 257/706; 257/712; 257/722; 257/737
(58) Field of Search ...................... 257/686, 77, 706, 257/712, 722, 737, 738, 778

(56) References Cited

U.S. PATENT DOCUMENTS

| 4,561,040 A | 12/1985 | Eastman et al. |
| 4,793,814 A | 12/1988 | Zifcak et al. |
| 4,860,444 A | 8/1989 | Herrell et al. |
| 4,868,712 A | 9/1989 | Woodman ................... 361/388 |
| 4,893,172 A | 1/1990 | Matsumoto et al. |
| 4,906,194 A | 3/1990 | Grabbe |

(List continued on next page.)

FOREIGN PATENT DOCUMENTS

| EP | 0392242 A2 | 10/1990 |
| EP | 0478188 A2 | 4/1992 |
| EP | 531724 | 3/1993 |
| WO | WO 00/03569 | 1/2000 |
| WO | WO 01/09952 | 2/2001 |

OTHER PUBLICATIONS

"Chip Column Package Structure," IBM Technical Disclosure Bulletin, vol. 40, No. 8 (Aug. 1997), pp. 117–118.

"Cooling System For Semiconductor Modules," IBM Technical Disclosure Bulletin, vol. 26, No. 3B (Aug. 1983), p. 1548.

Goldstein et al., "Packages," IEEE Spectrum (Aug. 2001), pp. 46–51.

*Primary Examiner*—David Nelms
*Assistant Examiner*—Mai-Huong Tran
(74) *Attorney, Agent, or Firm*—O'Melveny & Myers, LLP; N. Kenneth Burraston

(57) ABSTRACT

A three-dimensional, stacked semiconductor device assembly with microelectronic spring contacts, and components thereof, is disclosed. The assembly comprises a plurality of stacked modules, which are capable of being readily mounted to, and demounted from, one another. Each module of the assembly comprises a semiconductor device, comprising a die, mounted to an stacking substrate. The die and the stacking substrate are optionally capable of being readily mounted to, and demounted from one another. A bottommost module in the assembly is suitable for attaching directly to a substrate or other component, such as a printed circuit board, and a topmost component in the assembly preferably comprises a decoupling and/or termination substrate. Each semiconductor device in the assembly has terminals on a surface thereof, at least selected ones of which are provided with an contact element. In addition, each device preferably comprises one or more stop structures for the microelectronic springs on its terminal surface. Contact elements on the semiconductor device and between adjacent modules preferably comprise microelectronic lithographic-type molded spring contacts. Each stacking substrate additionally includes a conductive trace between individual ones of the contact elements. The stacking substrate optionally includes separate ground planes and/or power planes for controlled impedance signal traces. The assembly optionally includes a heat spreader disposed between individual ones of each module, preferably in contact with a non-terminal side of each semiconductor device, which serves as a heat sink and heat exchanger for waste heat generated by the device during operation.

43 Claims, 10 Drawing Sheets

U.S. PATENT DOCUMENTS

| | | |
|---|---|---|
| 4,949,163 A | 8/1990 | Sudo et al. |
| 5,016,138 A | 5/1991 | Woodman |
| 5,019,943 A | 5/1991 | Fassbender et al. |
| 5,021,924 A | 6/1991 | Kieda et al. |
| 5,032,896 A * | 7/1991 | Little et al. .................. 257/686 |
| 5,152,695 A | 10/1992 | Grabbe et al. |
| 5,212,406 A | 5/1993 | Reele et al. |
| 5,297,006 A | 3/1994 | Mizukoshi |
| 5,309,324 A | 5/1994 | Herandez et al. |
| 5,317,479 A | 5/1994 | Pai et al. |
| 5,343,075 A | 8/1994 | Nishino |
| 5,371,654 A | 12/1994 | Beaman et al. |
| 5,373,189 A | 12/1994 | Massit et al. |
| 5,381,042 A * | 1/1995 | Lerner et al. ................ 257/712 |
| 5,386,341 A | 1/1995 | Olson et al. |
| 5,473,196 A | 12/1995 | De Givry |
| 5,600,183 A | 2/1997 | Gates, Jr. |
| 5,605,592 A | 2/1997 | Burns |
| 5,614,766 A | 3/1997 | Takasu et al. |
| 5,656,856 A | 8/1997 | Kweon |
| 5,723,900 A | 3/1998 | Kojima et al. |
| 5,806,181 A | 9/1998 | Khandros et al. |
| 5,829,128 A | 11/1998 | Eldridge et al. |
| 5,917,707 A | 6/1999 | Khandros et al. |
| 5,926,951 A | 7/1999 | Khandros et al. ............. 29/843 |
| 5,969,952 A | 10/1999 | Hayashi et al. |
| 5,980,270 A | 11/1999 | Fjelstad et al. |
| 5,998,864 A | 12/1999 | Khandros et al. ........... 257/723 |
| 6,033,935 A | 3/2000 | Dozier, II et al. |
| 6,072,233 A | 6/2000 | Corisis et al. ............... 257/686 |
| 6,093,029 A | 7/2000 | Kwon et al. ................... 439/69 |
| 6,337,513 B1 * | 1/2002 | Clevenger et al. .......... 257/442 |
| 2001/0044225 A1 | 11/2001 | Eldridge et al. |

\* cited by examiner

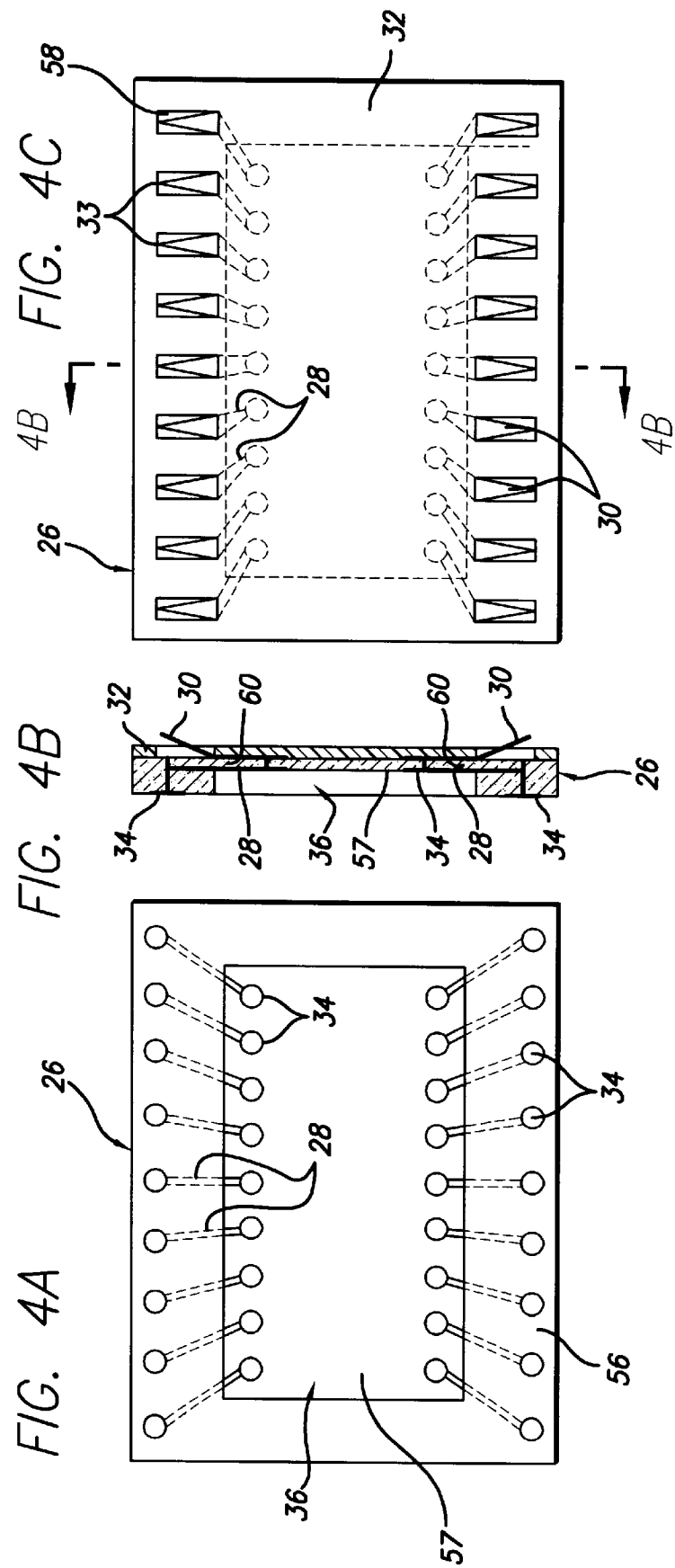

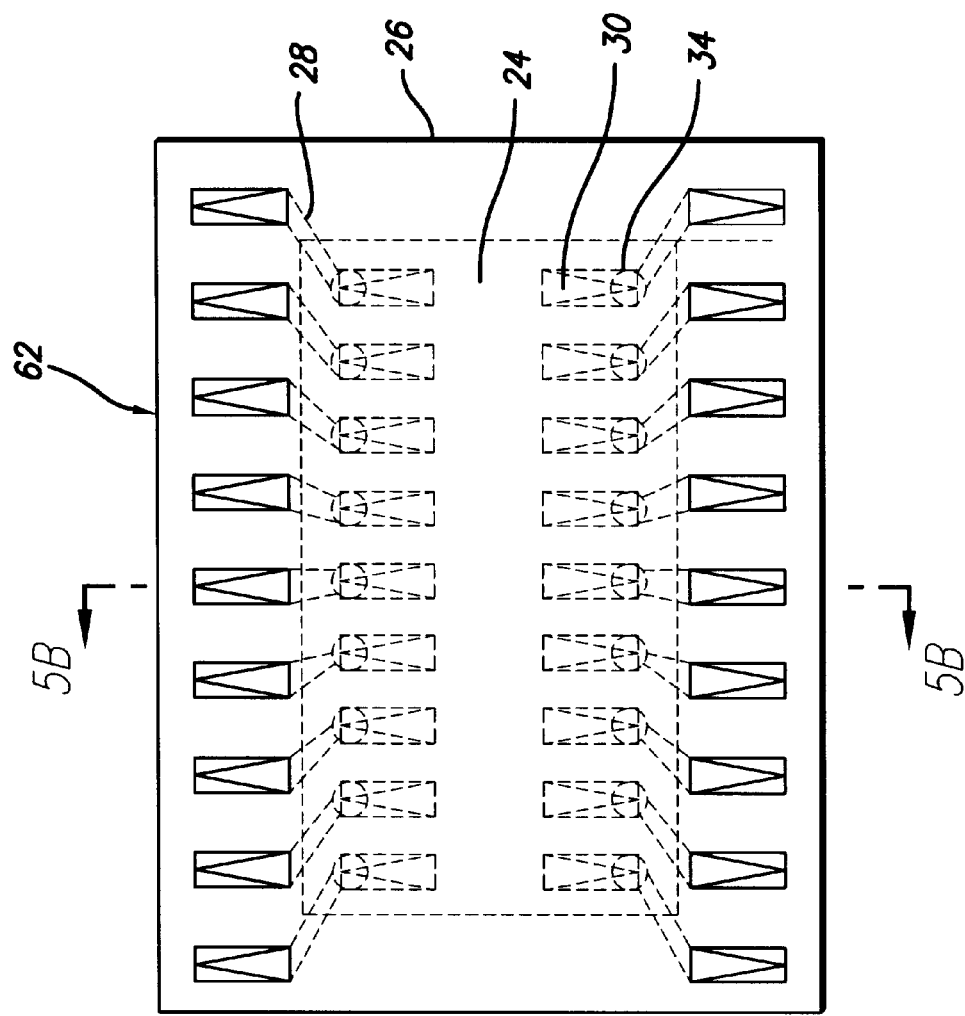
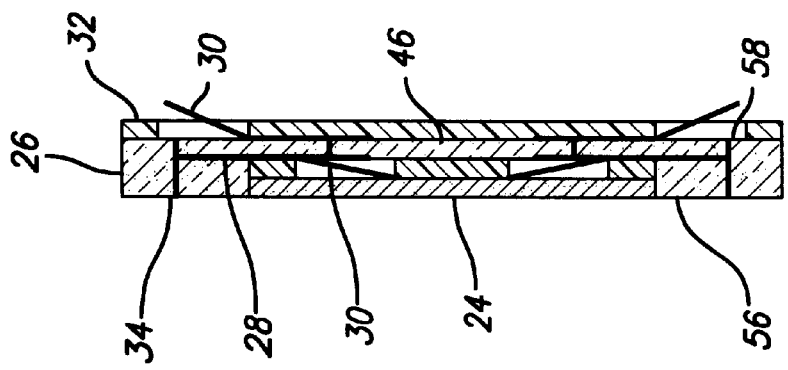

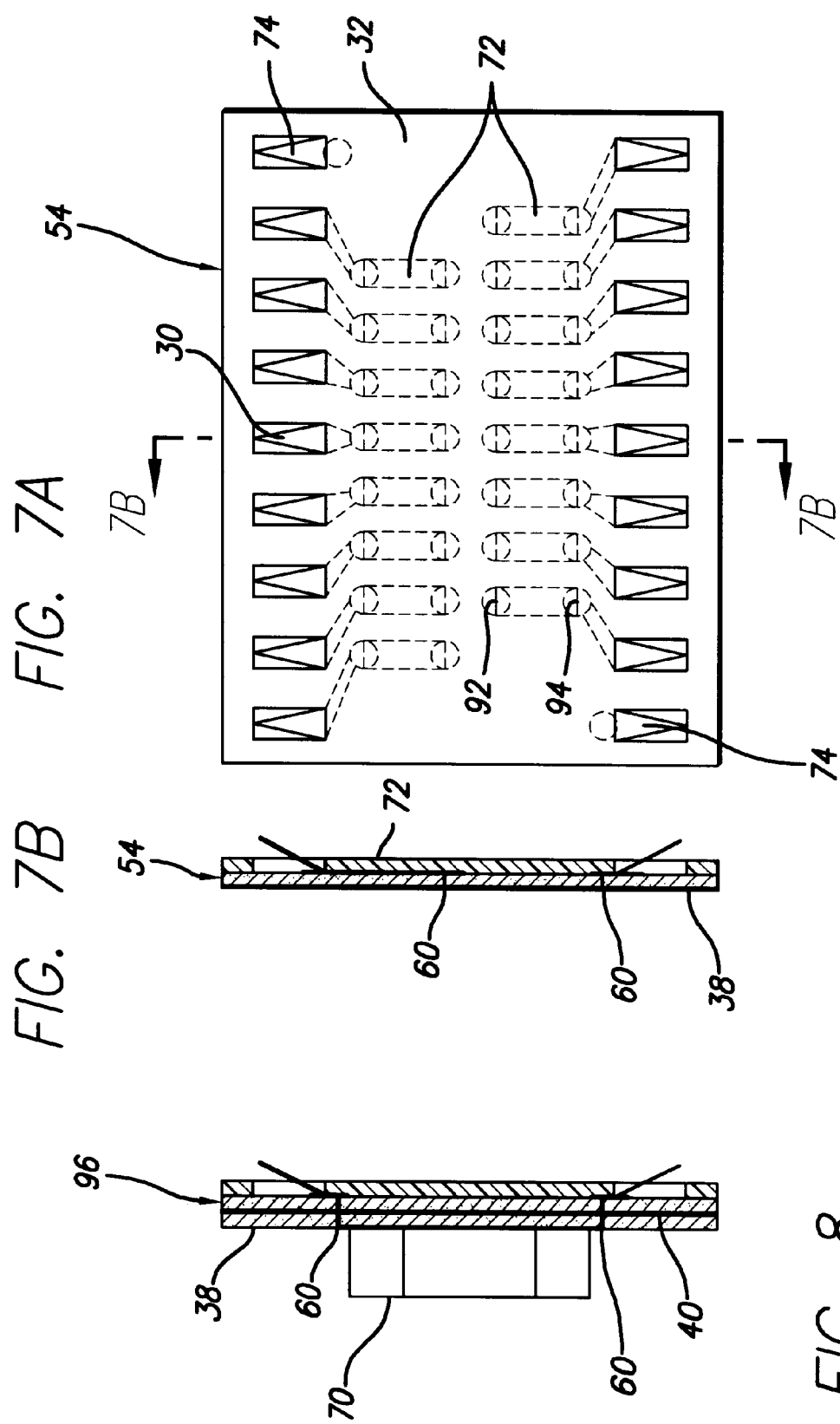

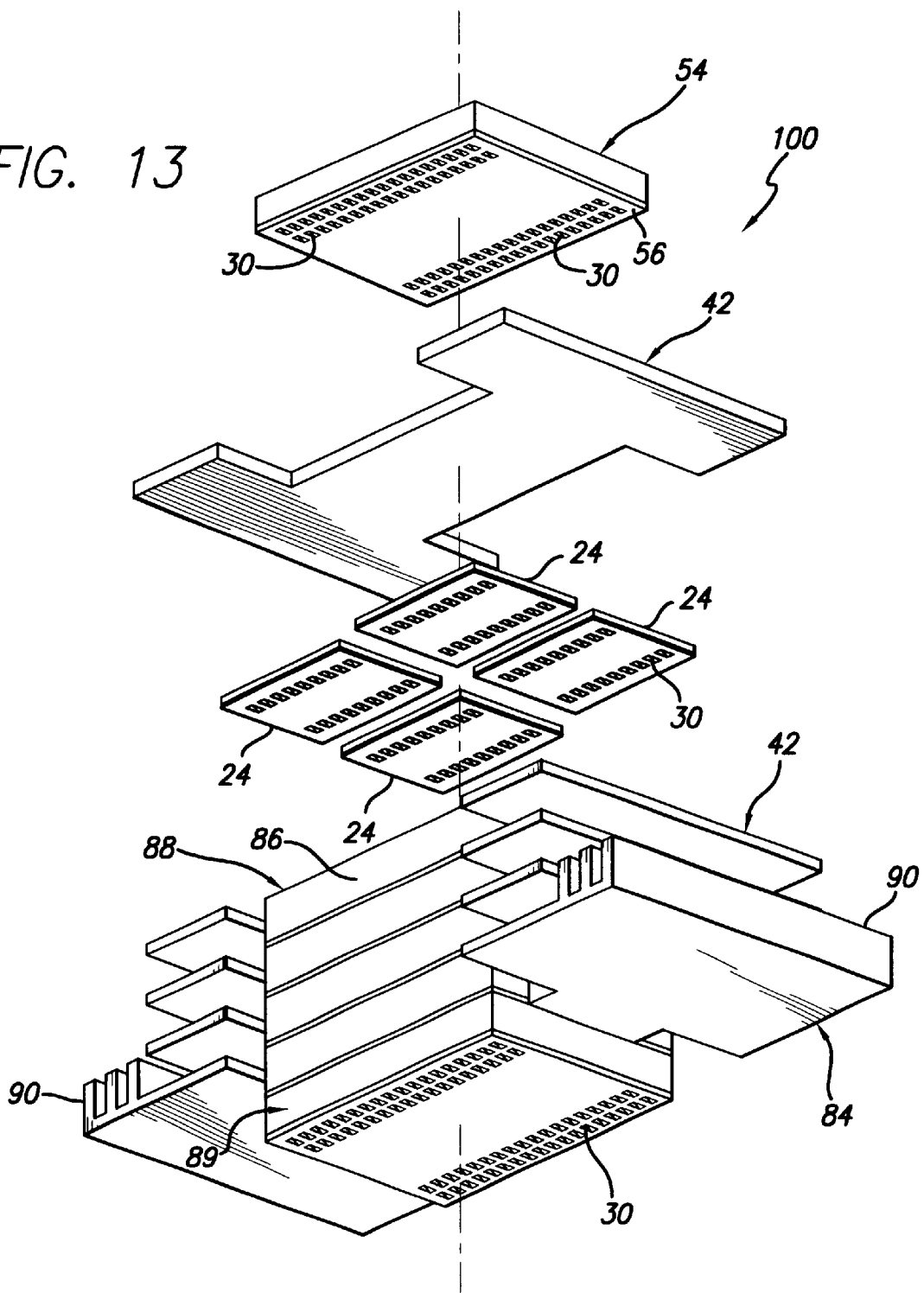

STACKED SEMICONDUCTOR DEVICE ASSEMBLY WITH MICROELECTRONIC SPRING CONTACTS

BACKGROUND OF THE INVENTION

1. Field of the Invention

The present invention relates to packaging of semiconductor devices, such as memory devices, in stacked, three-dimensional assemblies, and especially to high-density and ultra-high-density packaging; and more particularly to such assemblies which use resilient, microelectronic spring contacts as contact elements.

2. Description of Related Art

Semiconductor devices, such as memory chips, are frequently assembled into modules such as Single Inline Memory Modules (SIMM's), and similar assemblies. However, as electronic devices have become increasingly compact, while at the same time requiring increasing amounts of memory, SIMM's and similar assemblies are increasingly considered too bulky for many applications. Additionally, each semiconductor device on SIMM's and similar assemblies is integrated with its module using a relatively permanent (not readily demountable) connection method, and is not provided with connection elements that can be used both during wafer-level testing and during final assembly. Various three-dimensional, stacked assemblies of semiconductor devices have also been developed, and some of these assemblies are less bulky than SIMM's and similar assemblies. However, many of such prior stacked assemblies suffer from the other deficiencies of SIMM's noted above, and additional deficiencies such as being complex and expensive to manufacture, and being difficult to cool.

Commonly owned U.S. Pat. No. 5,998,864 discloses bare semiconductor devices stacked atop one another, which are offset in at least one direction so that an edge portion of each successive device in the stack extends beyond every device beneath it. Elongate contact elements extend from the bottommost device, and from the exposed edge portion of each of the remaining semiconductor devices in the stack, and connect with electrical terminals of a common stacking substrate. The stack makes use of elongate contact elements as disclosed, for example, in commonly owned U.S. Pat. No. 5,476,211 (Khandros), which are suitable for use during wafer-level burn-in and during final assembly. The assembly is highly compact, and readily fabricated at die scale. However, certain alternative structures are desirable, as further described herein.

Commonly owned, co-pending patent application Ser. No. 09/710,539, filed Nov. 9, 2000, entitled "LITHOGRAPHIC SCALE MICROELECTRONIC SPRING STRUCTURES WITH IMPROVED CONTOURS," and related commonly owned, co-pending application Ser. No. 09/364,788, filed Jul. 30, 1999, entitled "INTERCONNECT ASSEMBLIES AND METHODS," which applications are incorporated herein, in their entirety, by reference, disclose microelectronic spring contacts which are readily mass-produced at very fine pitches directly on terminals of semiconductor devices, such as dice and wafers, and on similar-scale substrates such as lead frames and connectors. Because of their fine pitch, low cost, and electrical performance, these microelectronic spring contacts are particularly advantageous for use in applications where a readily demountable, reusable electrical connection at a very compact scale is desired. In particular, such microelectronic spring contacts can serve as contacts both during a wafer-level device burn-in process, and during subsequent assembly of devices into a multi-component module.

There is a need, therefore, to take better advantage of microelectronic spring contacts such as described in the incorporated references in a compact and modular assembly of stacked semiconductor devices, such as a memory module. Additionally, there is a need to provide such an assembly with components for providing electrical termination and/or decoupling to a plurality of parallel semiconductor devices, for providing internal ground planes and/or power planes for controlled impedance signal traces, and for cooling the assembly. Such an assembly should be much more compact than SIMM's and similar assemblies, and more readily and cost-effectively manufactured, assembled, and/or repaired than three-dimensional stacked assemblies according to the prior art.

SUMMARY OF THE INVENTION

The present invention provides a three-dimensional, stacked semiconductor device assembly with microelectronic spring contacts, and components thereof, that overcomes the limitations of prior art stacked assemblies and other modular assemblies, such as SIMM's. The assembly comprises a plurality of stacked modules, which are capable of being readily mounted to, and demounted from, one another. Each module of the assembly comprises a semiconductor device, comprising a die (which may be a thinned die), mounted to a stacking substrate. The die and the stacking substrate are also capable of being readily mounted to, and demounted from one another, if desired. Any number of modules may be stacked according to the invention, limited only by the circuit configuration of the incorporated semiconductor devices. The bottommost module in the assembly is suitable for attaching directly to a substrate or other component, such as a printed circuit board, and the topmost module in the assembly preferably comprises a decoupling and/or termination substrate. The assembly may be held together using a relatively permanent method, such as by placing a suitable solder, adhesive, or other joining material between each module of the assembly. In the alternative, the assembly may be held together using a relatively demountable method, such as a compression frame and demountable mechanical fasteners; or by some combination of demountable and permanent methods.

Each semiconductor device in the assembly has terminals on a surface thereof, at least selected ones of which are provided with a contact element. In addition, each device preferably comprises one or more stop structures for the microelectronic springs on its terminal surface. Each contact element on the semiconductor device preferably comprises a microelectronic lithographic-type molded spring contact as further described in the incorporated references identified above. In the alternative, each contact element on the device comprises a contact pad or solder bump.

Each stacking substrate comprises a first mounting face, having a plurality of first contact elements disposed thereon, and a second mounting face, having plurality of second contact elements disposed thereon for contacting the first contact elements. In a preferred embodiment of the invention, the first contact elements comprise molded integral resilient free-standing microelectronic spring contacts as further described in the incorporated references identified above, and the second contact elements comprise contact pads. Each stacking substrate additionally comprises a semiconductor device mounting face, having a plurality of third contact elements disposed thereon. The device mounting face is preferably recessed below one of the first mounting face or the second mounting face. The third contact elements are configured for contacting corresponding contact elements on the semiconductor device. For example, in an embodiment of the invention, the contact elements on the semiconductor device comprise microelectronic spring contacts, and the third contact elements comprise contact pads. Where present on the stacking substrate, the microelectronic spring contacts are preferably provided with one or more stop structures, an exposed face (or faces) of which contacts an adjacent stacking substrate and/or semiconductor device. Each stacking substrate additionally includes a conductive trace between individual ones of the first, second, and third contact elements. The stacking substrate optionally includes separate ground planes and/or power planes for controlled impedance signal traces.

The assembly optionally includes a heat spreader disposed between individual ones of each module, preferably in contact with a non-terminal side of each semiconductor device, which serves as a heat sink and heat exchanger for waste heat generated by the device during operation. The heat spreaders preferably include cooling fins suitable for cooling, if desired, by passive or forced air convection. In the alternative, or in addition, the assembly additionally includes a fluid channel which may be used to direct a cooling fluid, such as ambient air, over or around the semiconductor device in each module.

A more complete understanding of the stacked semiconductor device assembly with microelectronic spring contacts, and components thereof, will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIG. 4A is a plan view of an exemplary stacking substrate for use in an assembly according to the invention, viewed from above a side of the stacking substrate having a mounting face for a semiconductor device and a mounting face for an adjacent stacking substrate.

FIG. 4B is a cross-sectional view of the stacking substrate shown in FIGS. 4A and 4C.

FIG. 4C is an alternative plan view of the stacking substrate shown in FIGS. 4A and 4B, viewed from above an opposite side of the stacking substrate having a mounting face for an adjacent stacking substrate.

FIG. 5A is a plan view of an exemplary assembled module, viewed from a side opposite the semiconductor device.

FIG. 5B is a cross-sectional view of the module shown in FIG. 5A.

FIG. 7A is a plan view of an exemplary termination substrate for use in an assembly according to the invention.

FIG. 7B is a cross-sectional view of the termination substrate shown in FIG. 7A.

FIG. 8 is a cross-sectional view of an exemplary termination and decoupling substrate similar to the termination substrate shown in FIGS. 7A and 7B.

FIG. 13 is an perspective view of an exemplary stacked semiconductor device assembly having a plurality of dice in selected modules.

DETAILED DESCRIPTION OF THE PREFERRED EMBODIMENT

The present invention satisfies the need for a compact, demountable stacked semiconductor device assembly that overcomes the limitations of prior art stacked assemblies. In the detailed description that follows, like element numerals are used to describe like elements illustrated in one or more figures.

Figure 1:
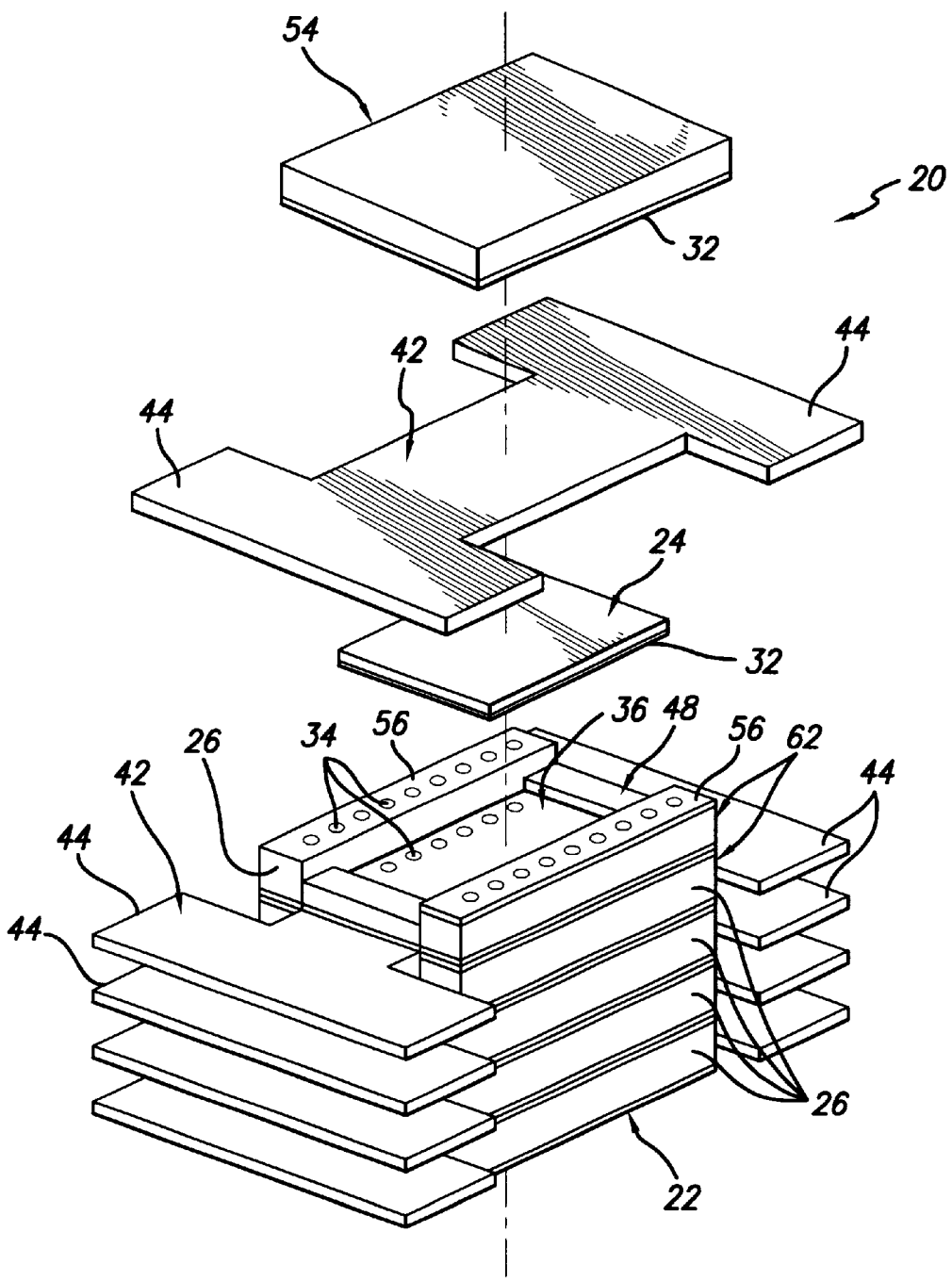
FIG. 1 is an exploded assembly diagram in a perspective viewed generally down from above the assembly, showing an embodiment of a stacked semiconductor device assembly according to the invention.

An exemplary stacked semiconductor device assembly 20 is shown in FIG. 1. The assembly 20 comprises a plurality of stacked modules 22, each module 62 of which comprises a semiconductor device 24, such as a memory module, microprocessor, I/O device, or controller, and a stacking substrate 26. In an embodiment of the invention, the stacking substrates 26 are substantially identical. The assembly preferably includes a termination substrate 54 on a terminal end of the plurality of stacked modules 22. Each module 62 of assembly 20 is optionally provided with a heat spreader 42, which is in thermal contact with semiconductor device 24 and passes through the sides of each respective stacking substrate 26 via channel 48. Heat spreader 42 preferably comprises at least one cooling fin 44. Further details of exemplary semiconductor devices, stacking substrates, termination substrates, and heat spreaders are provided in the description that follows.

The assembly 20 additionally includes a plurality of contact elements, such as contact pads 34, disposed between each module 62 of the plurality of modules 22. At least a selected one of the modules 62, typically, the bottommost module 25, is provided with contact elements for connecting to a mating electronic component, such as a system board. In one embodiment, shown in FIGS. 1 and 2A, the contact elements disposed between each module comprise contact pads 34 on a first mounting face 56 of the stacking substrate 26, which mate with resilient free-standing microelectronic spring contacts 30 on an opposite, second face 58 (shown in FIG. 2B) of an adjacent stacking substrate 26. In an alternative embodiment (not shown), the contact elements comprise contact pads on both first and second faces 56 and 58 of adjacent modules, wherein each contact pad is connected to a corresponding pad on an adjacent module by a resilient free-standing microelectronic spring contact, or connected pair of such contacts, on a separate interposing substrate which is interposed between each stacking substrate 26.

Figures 2A, 2B:
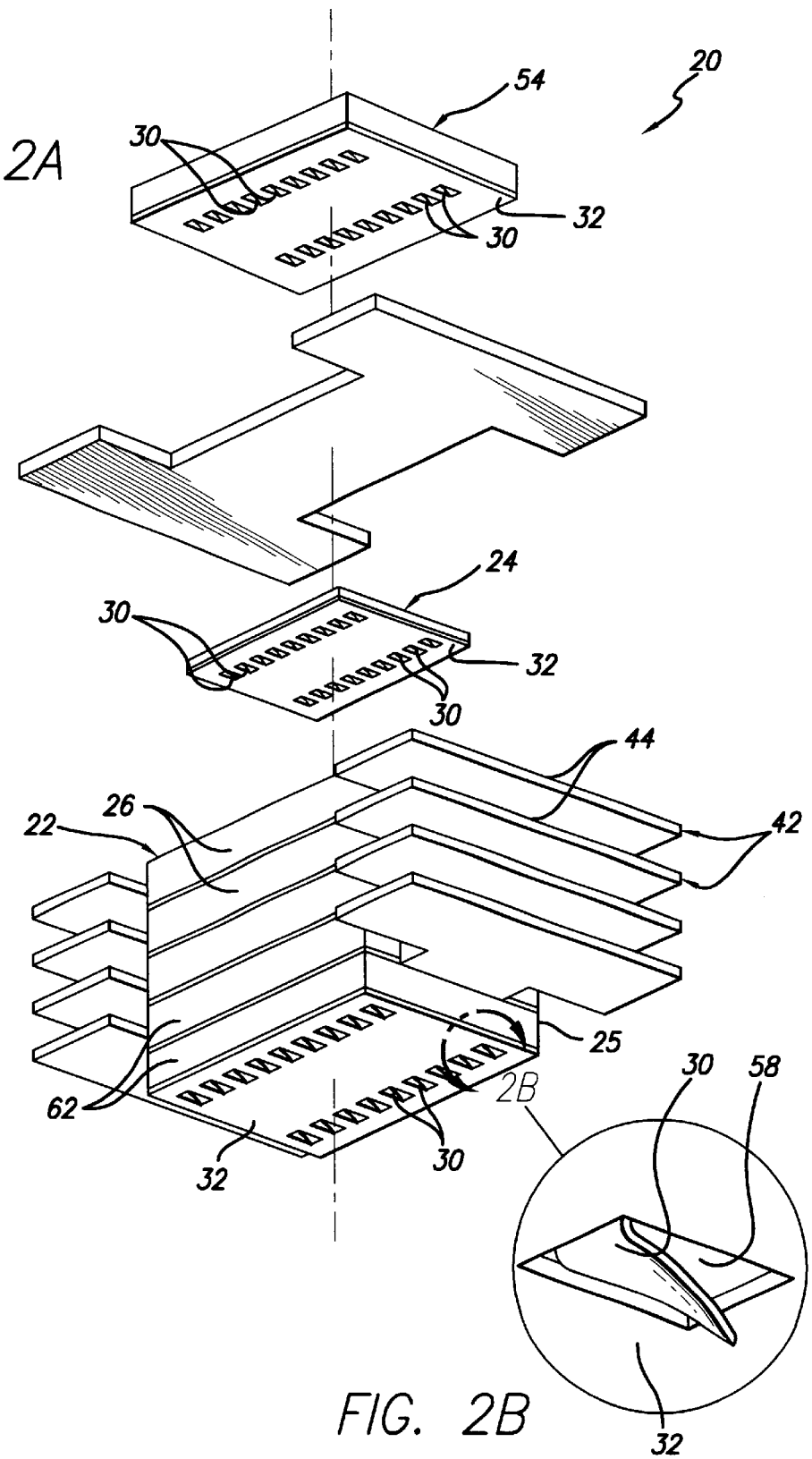
FIG. 2A is an exploded assembly diagram showing the assembly of FIG. 1, in an alternative view taken generally up from beneath the assembly.
FIG. 2B is a detail perspective view of an exemplary integral resilient freestanding microelectronic spring contact for use with an assembly according to the invention.

Similarly, each semiconductor device 24 of assembly 20 is connected to one of the stacking substrates by a plurality of contact elements disposed between each semiconductor device 24 and the stacking substrate 26 of its associated module 62. As which the contact elements between adjacent modules in the stack, in an embodiment of the invention, the contact elements comprise contact pads 34 on a selected one of the semiconductor device or stacking substrate, and corresponding microelectronic spring contacts 30 on the other of the selected semiconductor device or stacking substrate, as shown in FIGS. 1 and 2A. In an alternative embodiment (not shown), contact pads are provided on both the semiconductor device and stacking substrate of each module, and connected by microelectronic spring contacts on an interposing substrate, as previously described.

In general, the contact elements of the present invention, whether disposed between adjacent modules 62, or between a semiconductor device 24 and a stacking substrate 26, comprise means for connecting each semiconductor device to one of the stacking substrates, and means for connecting adjacent modules, respectively. A particularly preferred means for both connections (as briefly described above) comprises contact pads as known in the art connected to resilient free-standing microelectronic spring contacts as disclosed, for example, in the above-referenced application Ser. No. 09/710,539 and Ser. No. 09/364,788. Microelectronic spring contacts of the type described in the foregoing applications, referred to herein as "integral resilient free-standing microelectronic spring contacts" are believed to be particularly suitable for use in the present invention, because they are readily and cost-effectively manufactured at very fine pitches, and are capable of making repeated, reliable, and demountable connections. In the alternative, other types of microelectronic spring contacts may be used as contact elements in the present invention, for example, spring contacts such as described in the above-referenced U.S. Pat. No. 5,476,211, or in commonly owned, co-pending application Ser. No. 09/023,859, filed Feb. 13, 1998 and Ser. No. 08/819,464, filed Mar. 17, 1997, which are incorporated herein, in their entirety, by reference. Less preferably, other types of resilient contacts, or non-resilient contact elements such as microelectronic contact posts, pins, stab or piercing type contacts, and similar devices may be used. Other alternative contact elements for use in the present invention include solder balls or bumps as used in Ball Grid Array or flip-chip technology; however, these contact elements require reflow of solder during assembly or disassembly, which may be undesirable.

FIG. 2A shows the assembly 20 of FIG. 1 from a different perspective, which reveals exemplary integral resilient free-standing microelectronic spring contacts 30 on a face 58 of module 62, a face of semiconductor device 24, and a face of the termination substrate 54. Each spring contact 30 is positioned for contacting a corresponding contact pad, such as shown on face 56 and the bottom of recess 36 in FIG. 1. Stop structures 32 are preferably present adjacent to the spring contacts 30 on each mounting face. In essence, stop structures 32 are mechanical stops that prevent over-compression of spring contacts 30. They may also perform other functions, such as protecting the spring contacts from environmental contamination and establishing a mounting plane for assembly of adjacent modules. In the embodiment shown, stop structures 32 comprise a substantially planar sheet of substantially incompressible, nonconductive material that covers essentially all of the mounting faces where the spring contacts are located, such as face 58, except in areas immediately under and surrounding the flexible portion of each spring contact. This configuration in the area adjacent to a spring contact is more clearly visible in the detail view shown in FIG. 2B. In the alternative, the stop structures may cover a smaller portion of the mounting face, or may comprise free members to be sandwiched between components of assembly 20, or may be attached to the faces where the contact pads are located, such as mounting face 56 shown in FIG. 1. Further details pertaining to stop structures 32 are described in the commonly owned, co-pending application Ser. No. 09/364,855, filed Jul. 30, 1999, entitled "INTERCONNECT ASSEMBLIES AND METHODS," by Eldridge and Mathieu, which is hereby incorporated herein by reference.

Figure 3A:
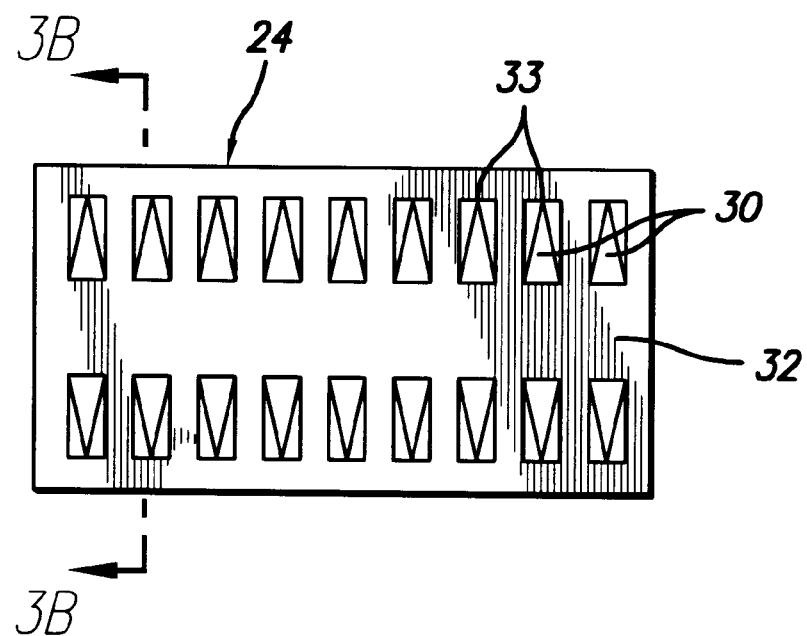
FIG. 3A is a plan view of an exemplary semiconductor device with microelectronic spring contacts for use in an assembly according to the invention.
Figure 3B:
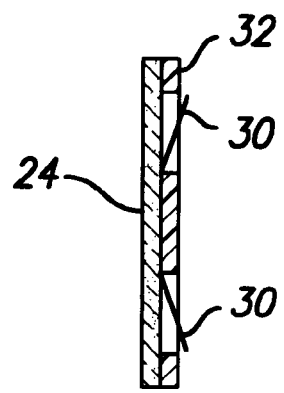
FIG. 3B is a cross-sectional view of the semiconductor device shown in FIG. 3A.

An exemplary semiconductor device 24 prepared for use in a module 62 of assembly 20 is shown in FIGS. 3A and 3B. Semiconductor device 24 typically comprises a semiconductor die containing an integrated circuit. For greater compactness, the semiconductor die may be thinned, if desired, by methods known in the art, e.g., lapping or grinding, plasma etching or other suitable techniques. Although the present invention is particularly useful for stacking memory devices, it is not limited to use therewith. FIG. 3A shows a plan view of linear arrays of spring contacts 30 and a surrounding stop structure 32 having an opening 33 for each contact. The relative proportions and shapes of device 24 and spring contacts 30 are merely exemplary, and it should be apparent that a great variety of shapes and relative proportions are possible, without departing from the scope of the invention. Any number of contact elements may be provided, and in various different locations, as required by the application. Openings 33 are shown as rectangular, but may be any shape which accommodates spring contacts 30, which may themselves be of various shapes. Nor is it necessary for all of the contacts to be of the same shape or type. It may be advantageous, for example, to provide contacts for a power or ground plane which are shaped differently from contacts for transmitting data signals.

Integral resilient free-standing microelectronic spring contacts, such as contacts 30, may be made using methods such as described in the commonly owned, copending United States patent application filed Feb. 12, 2001, entitled "METHOD FOR FORMING MICROELECTRONIC SPRING STRUCTURES ON A SUBSTRATE," by Eldridge and Wenzel (Ser. No. not yet assigned). Such spring contacts, when made by depositing (such as by plating, sputtering, or evaporation) a metallic material on a preformed layer of sacrificial material as more fully described, for example, in the foregoing reference, are referred to herein as being "molded." Molded microelectronic spring contacts may be formed directly on the semiconductor device or stacking substrate, or formed on a sacrificial substrate and transferred to the desired working substrate. In the alternative, other contact elements may be provided, such as contact pads or solder bumps. A cross-sectional view of device 24 is shown in FIG. 3B. The tips of spring contacts 30 protrude above stop structure 32 and away from device 24. This configuration is suitable for contacting a contact pad that is flush or recessed below the corresponding mounting surface of the stacking substrate. In an alternative embodiment, the spring contacts 30 may be recessed below the surface of stop structure 32, for contacting pads or terminals that protrude above the mounting surface of the stacking substrate.

An exemplary stacking substrate 26 for holding a semiconductor device in a module 62 of assembly 20 is shown in FIGS. 4A–4C. Stacking substrate 26 is comprised of a generally non-conducting material, preferably one suitable for semiconductor packaging, such as FR-4 or similar polymeric material, or ceramic. Generally, the material used for stacking substrate 26 should be capable of performing within the range of temperatures anticipated during operation of the assembly 20, should be compatible with the materials it will contact, and should be amenable for processing in conventional equipment for semiconductor packaging. The exemplary stacking substrate 26 shown comprises a generally flat, rectangular sheet having a first major surface comprising mounting face 56 and a recessed mounting face 57 for a semiconductor device, shown in FIG. 4A, and a second major surface comprising mounting face 58, that is covered almost entirely by stop structure 32 except at openings 33, shown in FIG. 4C. Mounting face 58 is spaced apart from and configured to mount to mounting face 56, such as on a corresponding face of an adjacent stacking substrate, thereby enabling modular stacking. In the exemplary embodiment, mounting face 57 is recessed below face 56 to accommodate the thickness of semiconductor device 24. However, stacking structure 26 may alternatively be configured in a variety of different shapes, so long as the selected shape is stackable in a modular fashion, and includes a mounting face 57 for a semiconductor device and opposing mounting faces 56, 58 for mounting to adjacent stacking substrates. For example, the sheet-like configuration may be folded or contoured, and/or may be provided with protrusions, detents, holes and recesses, and/or need not be generally rectangular, to accommodate various application requirements.

Referring to FIG. 4A, mounting face 57 for semiconductor device 24 comprises a bottom surface of recess 36, and is provided with a plurality of contact elements, such as contact pads 34, for contacting corresponding contact elements on device 24. Face 57 need not be recessed if the face 58 of an adjacent stacking substrate is appropriately recessed or shaped to accommodate a device protruding above mounting face 56. Contact pads 34 correspond to the contact tip of spring contacts 30 on device 24; it should be apparent that if device 24 is provided with contact pads, face 57 may be provided with spring contacts, solder balls, or other complementary contact elements. Each contact pad 34 is connected by a conductive trace 28 to a corresponding contact pad 34 (or other contact element) on face 56, and to a corresponding spring contact 30 (or other contact element) on face 58. A cross-sectional view of an exemplary conductive trace 28 is shown in FIG. 4B. Trace 28 passes through via 60 to connect the contact elements on face 58 with those on opposite faces 56, 57. Details and variations of the spring contacts 30 and stop structure 32 are as described in connection with semiconductor device 26, and elsewhere generally herein.

FIGS. 5A and 5B show an exemplary assembled module 62, comprising the semiconductor device 24 shown in FIGS. 3A and 3B assembled into the stacking substrate 26 shown in FIGS. 4A–4C. As shown in FIG. 5A, each spring contact 30 on semiconductor device 24 overlies and contacts a corresponding one of the contact pads 34 on stacking substrate 26, whereby each terminal of device 24 is connected to one of the conductive traces 28. Device 24 may be adhered to substrate 26 using an adhesive 46, such as a non-conductive adhesive. More typically, no adhesive is used and device 24 is held in recess 36 by mechanical pressure supplied by an adjacent component, which facilitates ready disassembly of module 62. In such embodiments, it is particularly advantageous to use resilient free-standing microelectronic spring contacts between device 24 and stacking substrate 26, because such contacts can be provided with a relatively long stroke (range of motion perpendicular to the substrate) that compensates for dimensional errors of mating components, and prevents tolerance build-up as additional modules are added to a stack. In the alternative, device 24 may be held in place by solder or conductive adhesive (not shown), or by an interlocking mechanical element (not shown) such as, for example, used in many electrical connectors. FIG. 5B shows the top (exposed) surface of device 24 positioned roughly co-planar with face 56. In alternative embodiments of the invention, device 24 may protrude above face 56, or (as shown in FIG. 1) be recessed below face 56.

Figure 6:
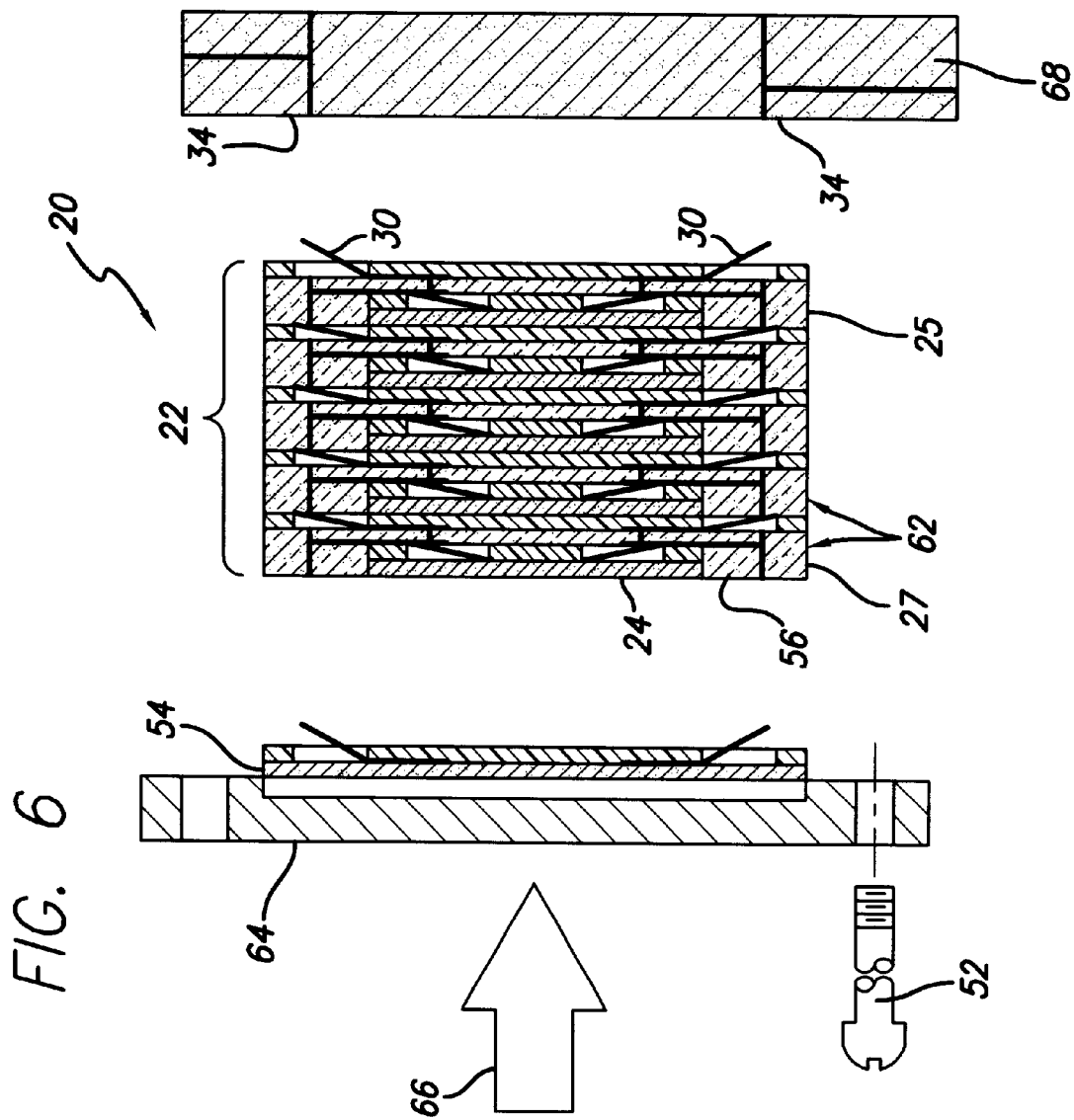
FIG. 6 is a cross-sectional view of an exemplary stacked semiconductor device assembly according to the invention.

An exemplary stacked semiconductor device assembly 20, comprised of five modules 62 of the type shown in FIGS. 5A and 5B, and a termination substrate 64, is shown in FIG. 6. Assembly 20 is held together and held to system board 68 by mechanical pressure supplied in the direction of arrow 66 by compression frame 64, which is connected to system board 68 by a suitable fastener, such as machine screw 52. In the alternative, the assembly 20, or selected components of it, may be adhered together by an adhesive applied between adjacent surfaces of each module and the termination substrate applied apart from the contact elements, by solder or conductive adhesive applied at selected contact elements, by interlocking mechanical elements, or by any other method compatible with assembly 20. Contact pads 34 on system board 68 are positioned to contact corresponding spring contacts 30 (or other suitable contact elements) on bottommost module 25. Electrically parallel configuration of devices 24 is shown, although alternative configurations may be provided without departing from the scope of the invention. A termination substrate 54 is preferably mounted to face 56 of terminal module 27, for termination of circuits connected to contact elements on face 56.

An exemplary termination substrate 54 is shown in FIGS. 7A–7B. In an embodiment of the invention, termination substrate 54 comprises a conventional packaging material, e.g., FR-4, ceramic BT resin or other material, with resistors patterned in a semiconductor material embedded therein. In the alternative, termination substrate 54 comprises a suitable packaging material, such as may comprise stacking substrate 26, and the termination resistors 72 comprise discrete components. A first terminal 92 of each resistor is connected to ground plane 38, such as by a conductive trace passing through via 60. A second terminal 94 of each resistor is similarly connected to one of the contact elements, e.g., spring contacts 30, on a mounting face of termination substrate 54. The ground plane 38 is directly connected (without any intervening resistor) to at least one of the contact elements, such as to spring contacts 34, which function as ground pins. The configuration of contact elements and/or a stop structure 32 on the mounting face is as previously described in connection with the mounting face 58 of a stacking substrate 26, in as much as the mounting face of termination substrate 54 is designed to mate with an opposite mounting face 56 of a terminal module. Although the exemplary termination substrate 54 is shown as a substantially rectangular sheet with two major faces, it should be appreciated that, like the stacking substrates, a variety of alternative shapes are within the scope of the invention, so long as configured to mate with the exposed mounting face 56 of a stacking substrate 26.

The termination substrate may be modified to provide a termination and decoupling substrate for improving the electrical performance of assembly 20. An exemplary termination and decoupling substrate 96 is shown in FIG. 8. Decoupling substrate 96 comprises the same features as termination substrate 54, and additionally comprises a power plane 40 connected to a decoupling capacitor 70, an opposite terminal of which is connected to ground plane 38. Power plane 40 is directly connected to one of spring contacts 74 by a trace passing through via 60, and ground plane 38 is connected to the other one of contacts 74 in a similar fashion. Decoupling substrate 96 may be substituted for termination substrate 54 in assembly 20.

Figure 9:
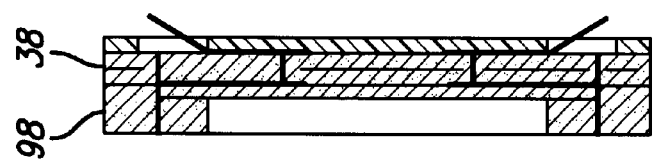
FIG. 9 is an cross-sectional view of an exemplary stacking substrate having an integrated ground or power plane.

For some applications, it may be preferable to add an internal ground plane to each stacking substrate for controlled impedance signal traces. An exemplary stacking substrate with 98 with an internal ground plane 38 is shown in FIG. 9. Additional capacitance may be provided to the assembly 20 by providing each stacking substrate 98 with an internal power plane (not shown) spaced a distance apart and parallel to the ground plane 38.

Figure 10A:
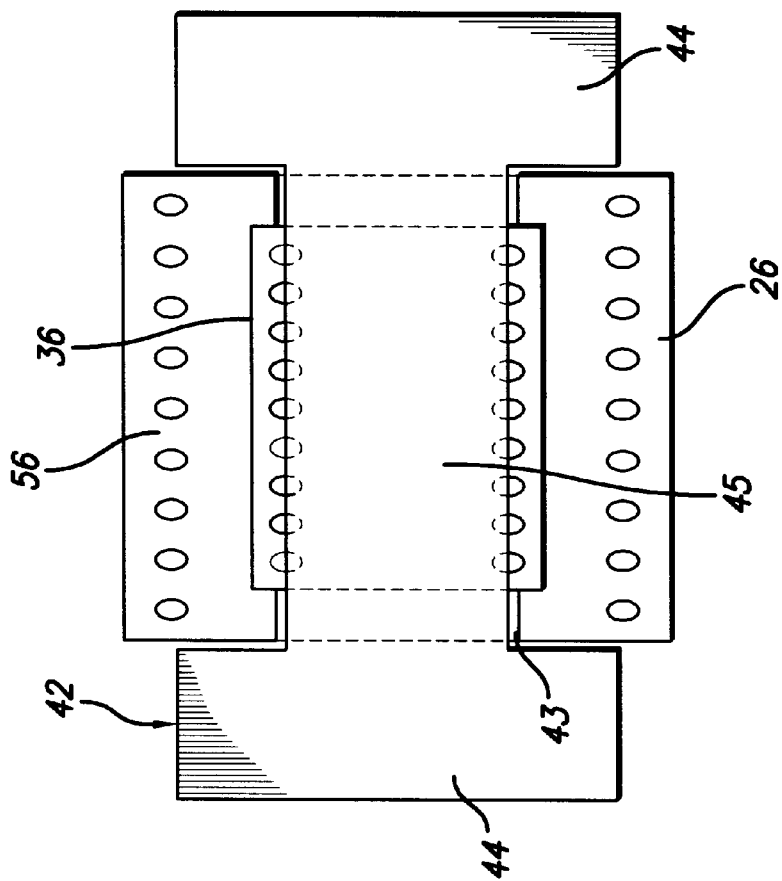
FIG. 10A is a plan view of an exemplary stacking substrate with a heat spreader.
Figure 10B:
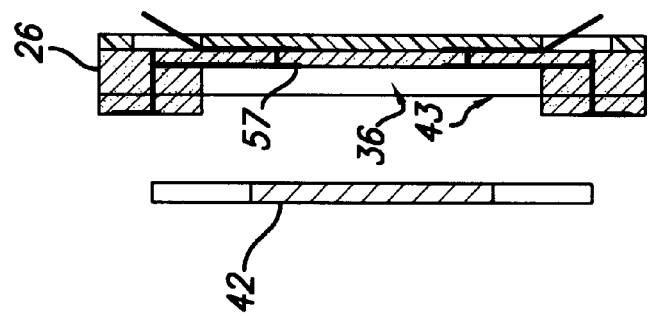
FIG. 10B is an exploded cross-sectional view of the stacking substrate and heat spreader shown in FIG. 10A.

For many applications, cooling of assembly 20 will be required during operation of semiconductor devices 24. To accommodate cooling, stacking substrate 26 may be provided with additional features, such as notch 43 for insertion of a heat spreader 42. A heat spreader is a heat transfer component for removing waste heat generated by semiconductor devices 24. Heat spreader 42 is configured to efficiently absorb heat generated by a semiconductor device, and to conduct the heat to a portion of the spreader, such as a cooling fin, configured to emit the heat thereby removing it from the assembly. In an embodiment of the invention, heat spreader 42 comprises a shaped plate of thermally conductive material, such as copper or aluminum, as shown in FIGS. 10A and 10B. Spreader 42 comprises a heat absorbing portion 45 configured for contacting a surface of a semiconductor device that is placed in recess 36. A heat transfer paste may be placed between heat spreader 42 and an associated semiconductor device, to increase heat transfer to spreader 42. Heat spreader 42 may be held in position by a friction fit in notch 43 under pressure from an adjacent module, as shown. In the alternative, it may be independently attached or adhered to stacking substrate 26, such as by using a fastener or an adhesive (not shown). Spreader 42 additional comprises at least one cooling fin 44 external to stacking substrate, and more preferably, at least two cooling fins 44, as shown in FIG. 10A. Heat is conducted from heat absorbing portion 45 to cooling fins 44, where it is removed from the stack by convective and radiative cooling. The capacity of heat spreader 42 for heat removal may be increased as necessary using techniques known in the art, such as surface treatment to increase heat absorption and radiation from the surface of spreader 42, forcing air or other cooling fluid over cooling fins 44, increasing the plate thickness of the spreader, increasing the size of the cooling fins, and so forth. It should be apparent that the exemplary heat spreader shown in FIGS. 10A and 10B may be modified in numerous ways, without departing from the scope of the invention. Further views of heat spreaders in a stacked assembly are shown in FIGS. 1, 2A, and 13.

Figure 11A:
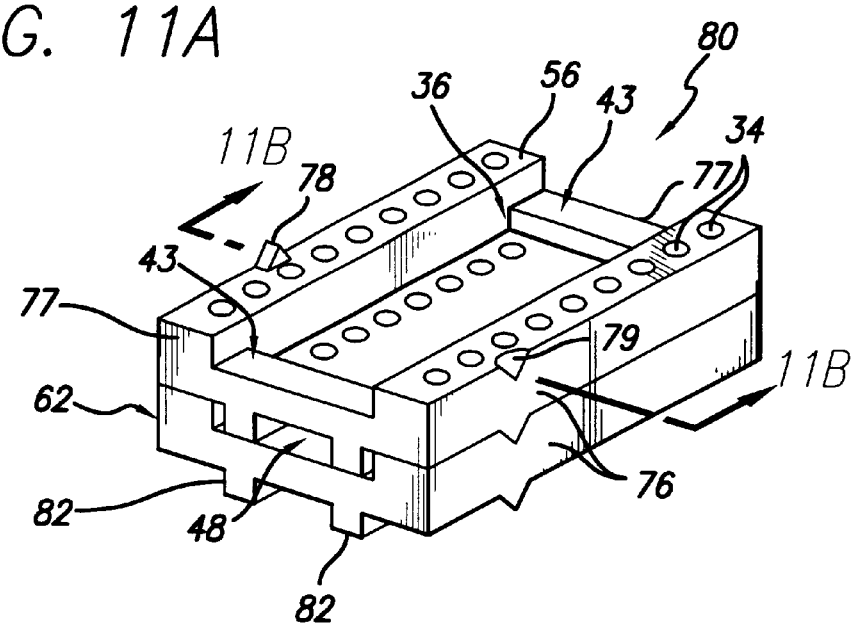
FIG. 11A is a perspective view of an exemplary stacked semiconductor device assembly having channels for a thermal control fluid.
Figure 11B:
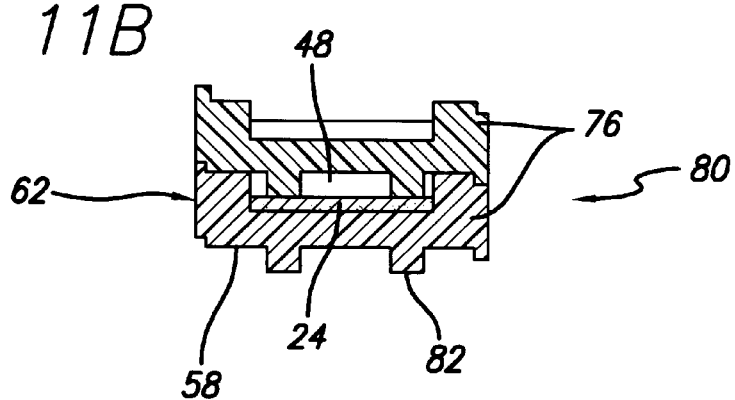
FIG. 11B is a cross-sectional view of the assembly shown in FIG. 11A.

An alternative method for cooling assembly 20 comprises passing a cool thermal control fluid (such as ambient air) directly over a surface of the semiconductor device mounted to each stacking substrate in the assembly. FIGS. 11A and 11B show an exemplary assembly 80 of stacking substrates 76 (two of many shown) comprising a plurality of channels 48 for cooling fluid, at least one of which is disposed in selected ones of each module 62 in assembly 80. In exemplary assembly 80, each stacking substrate 76 is provided with notches 43 in mounting face 56, that expose the recess 36 for a semiconductor device to opposite exterior sides 77 of stacking substrate 76. On the opposite mounting face 58, chip bosses 82 are provided for holding the semiconductor device in position at the bottom of recess 36. When stacking substrates 76 are assembled with semiconductor device 24 to form module 62, a channel 48 for cooling fluid is defined in module 62 by cooperating portions of stacking substrates 76. A thermal control fluid, such as ambient air, may be directed through channel 48 to cool semiconductor device 24.

Figure 12:
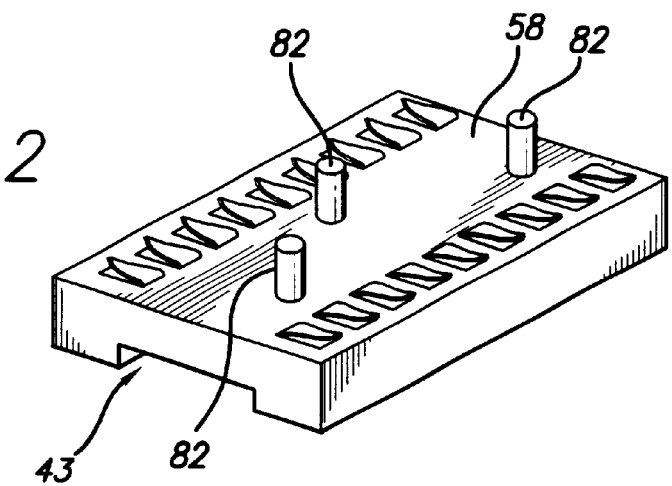
FIG. 12 is a perspective view of an exemplary stacking substrate for use in an stacked semiconductor assembly utilizing a thermal control fluid.

FIG. 12 shows an exemplary alternative configuration for chip bosses 82, wherein the bosses are peg-like rather than rail-like as shown in FIGS. 11A–11B. Both types of bosses serve the same function of holding a semiconductor device against its mounting face while causing minimal obstruction of channel 48. It should be apparent that a great many other variations are possible in the shape of the stacking substrates to provide a cooling channel 48 as described above, without departing from the scope of the invention.

Referring again to FIGS. 11A and 11B, stacking substrates 76 are optionally provided with at least one alignment feature, such as alignment tab 78 which mates which alignment detent 79 in an adjacent stacking substrate. Although triangular prism-shaped alignment features are shown, it should be apparent that a useful alignment function may be performed by a variety of different shapes. Such features may be formed integrally with the body of stacking substrates 76, or may be provided by attaching independent components. Alignment features, such as tab 78 and detent 79, are not limited for use with modules having cooling channels, but may be provided on other types of stacking substrates as well. As an alternative to discrete alignment features, the mounting faces of the stacking substrates may be configured to be self-aligning by suitable contouring and/or folding. However, it is anticipated that generally planar mounting faces will be more readily manufactured and used with electronic components such as are currently in use.

FIG. 13 shows an alternative embodiment of the invention, wherein at least selected ones of stacking substrates 86 are mounted to a plurality of semiconductor devices 24 to comprise ultra-high density assembly 100. Stacked semiconductor device assembly 100 additionally includes a termination substrate 54 and heat spreaders 42, as previously described. However, certain variations are evident. For example, the number and density of spring contacts 30 on the stacking substrates 86 and termination substrate 54 is greater than in previous examples, for handling the increased number of semiconductor devices. More significantly, the modules are not identical, and are configured to mount to different types of semiconductor devices. For example, the heat spreader 84 for the bottommost module 89 has been modified to comprise enhanced cooling fins 90. Such modifications may be appropriate, for example, if the bottommost module 89 is mounted to a relatively high-power semiconductor device, such as a microprocessor. Various other modifications as described herein can additionally, or in the alternative, be made to provide as much cooling capacity as is required for the assembly.

Assembly 100 exemplifies a very compact assembly of semiconductor devices that is readily achieved using an assembly according to the present invention. The preferred contact elements, i.e., integral resilient free-standing microelectronic spring contacts, are particularly advantageous as such assemblies become more compact and more complex. Such contacts may be provided at sub-micron pitches and hence require very little area on a mounting face. The contacts provide reliable and repeatable wiping connections and are amenable to economical mass-production. Furthermore, the contacts are readily demountable, and can be made permanent if desired. Using an assembly such as stacked assembly 100, an entire system of semiconductor devices can be incorporated in a compact, three dimensional volume of almost any desired shape. For some applications, the assembly may be connected (with appropriate modifications to packaging of the assembly) directly to the I/O devices and other equipment to be controlled, perhaps eliminating the need for a system board. More compact and robust intelligent assemblies, such as various types of autonomous robots, may therefore be enabled. Other potential applications and benefits of compact semiconductor device assemblies, such as assembly 100, are too numerous to mention.

Having thus described a preferred embodiment of a stacked semiconductor device assembly with microelectronic spring contacts, and components thereof, it should be apparent to those skilled in the art that certain advantages of the within system have been achieved. It should also be appreciated that various modifications, adaptations, and alternative embodiments thereof may be made within the scope and spirit of the present invention. For example, an assembly using molded integral resilient contacts has been illustrated, but it should be apparent that the inventive concepts described above would be equally applicable for use with other types of microelectronic spring contacts. The invention is further defined by the following claims.

What is claimed is:

1. A stacked semiconductor device assembly comprising:
   a plurality of semiconductor devices, each said semiconductor device comprising a first plurality of elongate contact elements attached to said semiconductor device; and
   a plurality of stacked substrates, each said stacked substrate configured to receive one of said semiconductor devices, each said stacked substrate comprising:
      a first plurality of terminals disposed to receive ones of the elongate contact elements of said one of said semiconductor devices, and
      a second plurality of terminals;
   a second plurality of elongate contact elements disposed to interconnect ones of said second plurality of terminals of one of said stacked substrates with ones of said second plurality of terminals of an adjacent one of said stacked substrates.

2. The stacked semiconductor device assembly of claim 1, wherein said second plurality of elongate contact elements comprise integral resilient free-standing microelectronic spring contacts.

3. The stacked semiconductor device assembly of claim 2, further comprising a stop structure disposed to limit compression of ones of said spring contacts.

4. The stacked semiconductor device assembly of claim 3 further comprising a plurality of stop structures.

5. The stacked semiconductor device assembly of claim 2, wherein said spring contacts are molded.

6. The stacked semiconductor device assembly of claim 1, wherein said first plurality of elongate contact elements comprise integral resilient free-standing microelectronic spring contacts.

7. The stacked semiconductor device assembly of claim 6, further comprising a stop structure disposed to limit compression of ones of said spring contacts.

8. The stacked semiconductor device assembly of claim 6, wherein said spring contacts are molded.

9. The stacked semiconductor device assembly of claim 7 further comprising a plurality of said stop structures.

10. The stacked semiconductor device assembly of claim 1, wherein said plurality of stacked substrates and said plurality of semiconductor devices compose a plurality of substantially similar stacked modules.

11. The stacked semiconductor device assembly of claim 1, wherein each of said semiconductor devices is positioned in a recess of one of said stacked substrates.

12. The stacked semiconductor device assembly of claim 1, further comprising a termination substrate comprising a ground plane and a terminal resistor.

13. The stacked semiconductor device assembly of claim 12, wherein said termination substrate further comprises a power plane decoupled from said ground plane by a capacitor.

14. The stacked semiconductor device assembly of claim 1, further comprising a heat spreader disposed between adjacent stacked substrates.

15. The stacked semiconductor device assembly of claim 14, wherein said heat spreader further comprises a cooling fin.

16. The stacked semiconductor device assembly of claim 1, further comprising a channel for cooling fluid.

17. The stacked semiconductor device assembly of claim 1, wherein said plurality of stacked substrates are adhered to one another with an adhesive.

18. The stacked semiconductor device assembly of claim 1, wherein said plurality of stacked substrates are held together by at least one mechanical fastener.

19. The stacked semiconductor device assembly of claim 1, further comprising a plurality of electrical traces interconnecting ones of said first plurality of terminals and ones of said second plurality of terminals.

20. The stacked semiconductor device assembly of claim 1, wherein each said stacked substrate is configured to receive at least two of said semiconductor devices, wherein said first plurality of terminals of each of said stacked substrates is configured to receive ones of the elongate contact elements of said at least two semiconductor devices.

21. A stacking substrate for use in a stacked semiconductor device assembly, comprising:
   a substrate having a plurality of faces, said plurality of faces comprising a first face and a second face spaced apart from said first face and configured to mount thereto, and a third face configured for mounting to a semiconductor device;
   a first plurality of contact elements disposed adjacent to said first face;
   a second plurality of contact elements disposed adjacent to said second face;
   a third plurality of contact elements disposed adjacent to said third face; and
   a plurality of conductive traces interior to said substrate, ones of which are connected to corresponding ones of said first plurality of contact elements, corresponding ones of said second plurality of contact elements, and corresponding ones of said third plurality of contact elements;
   wherein said substrate is configured for stacking in a stack of substantially identical substrates, wherein said second plurality of contact elements are elongate, compressible spring contacts disposed to be compressed by and thereby form an electrical connection with corresponding ones of said first plurality of contact elements on an adjacent stacked substrate.

22. The stacking substrate of claim 21, wherein said third face is recessed below said first face.

23. The stacking substrate of claim 21, wherein said third face is elevated above said first face.

24. The stacking substrate of claim 21, wherein said first face and said third face are substantially coplanar.

25. The stacking substrate of claim 21, further comprising a stop structure disposed to limit compression of ones of said spring contacts.

26. The stacked semiconductor device assembly of claim 25 further comprising a plurality of said stop structures.

27. A stacked semiconductor device assembly, comprising:
a plurality of stacked modules, wherein each of said plurality of stacked modules further comprises at least one semiconductor device mounted to a stacking substrate;
first connecting means for connecting each of said at least one semiconductor device to one of the stacking substrates, wherein said first connecting means comprises a first plurality of elongate, compressible spring contacts disposed to compress in connecting a semiconductor device to a stacking substrate; and
second connecting means for connecting adjacent modules of said plurality of stacked modules.

28. The stacked semiconductor device assembly of claim 27, further comprising a stop structure disposed to limit compression of ones of said first spring contacts.

29. The stacked semiconductor device assembly of claim 28 further comprising a plurality of said stop structures.

30. The stacked semiconductor device assembly of claim 27 wherein said first spring contacts are molded.

31. The stacked semiconductor device assembly of claim 27, wherein said second connecting means comprises a second plurality of elongate, compressible spring contacts disposed to compress in connecting adjacent stacking substrates.

32. The stacked semiconductor device assembly of claim 31, further comprising a stop structure disposed to limit compression of ones of said second spring contacts.

33. The stacked semiconductor device assembly of claim 32 further comprising a plurality of said stop structures.

34. The stacked semiconductor device assembly of claim 31, wherein said second spring contacts are molded.

35. The stacked semiconductor device assembly of claim 31, wherein said second connecting means for connecting said plurality of modules further comprises a plurality of electrical traces disposed inside each of said plurality of stacking substrates.

36. The stacked semiconductor device assembly of claim 27, wherein said plurality stacked modules comprise substantially identical modules.

37. The stacked semiconductor device assembly of claim 27, wherein each said at least one semiconductor device of each of said plurality of modules is positioned in a recess of each said stacking substrate.

38. The stacked semiconductor device assembly of claim 27, further comprising a termination substrate adjacent to an end one of said plurality of modules, whereby said plurality of modules are electrically connected to a ground plane through a plurality of terminal resistors.

39. The stacked semiconductor device assembly of claim 38, wherein said termination substrate further comprises a power plane decoupled from said ground plane by a capacitor.

40. The stacked semiconductor device assembly of claim 27, further comprising a plurality of heat spreaders, at least one of which is disposed between selected adjacent ones of said plurality of modules.

41. The stacked semiconductor device assembly of claim 27, further comprising a plurality of channels for cooling fluid, at least one of which is disposed in selected ones of said plurality of modules.

42. The stacked semiconductor device assembly of claim 27, wherein said plurality of modules are adhered to one another with an adhesive.

43. The stacked semiconductor device assembly of claim 27, wherein said plurality of modules are held together by at least one mechanical fastener.

* * * * *